(12) United States Patent
Park et al.

(10) Patent No.: US 8,189,386 B2
(45) Date of Patent: May 29, 2012

(54) NON-VOLATILE MEMORY DEVICE AND ASSOCIATED PROGRAMMING METHOD USING ERROR CHECKING AND CORRECTION (ECC)

(75) Inventors: June-hong Park, Seongnam-si (KR); Chi-weon Yoon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 228 days.

(21) Appl. No.: 12/458,437

(22) Filed: Jul. 13, 2009

(65) Prior Publication Data
US 2010/0027336 A1 Feb. 4, 2010

(30) Foreign Application Priority Data

Jul. 29, 2008 (KR) ........................ 10-2008-0074092

(51) Int. Cl.
*G11C 11/34* (2006.01)

(52) U.S. Cl. .............................. 365/185.09; 365/185.03

(58) Field of Classification Search ............. 365/185.09, 365/185.18, 185.22, 201, 185.03; 714/48, 714/52, 54, 704
See application file for complete search history.

(56) References Cited

U.S. PATENT DOCUMENTS

| | | | |
|---|---|---|---|
| 6,233,717 B1 * | 5/2001 | Choi | 714/805 |
| 6,917,547 B2 * | 7/2005 | Kanamori et al. | 365/200 |
| 7,304,893 B1 * | 12/2007 | Hemink et al. | 365/185.22 |
| 7,305,596 B2 | 12/2007 | Noda et al. | |
| 7,352,630 B2 | 4/2008 | Lee et al. | |
| 2005/0276116 A1 * | 12/2005 | Ide et al. | 365/185.22 |
| 2008/0002468 A1 | 1/2008 | Hemink | |
| 2009/0019321 A1 * | 1/2009 | Radke | 714/54 |

FOREIGN PATENT DOCUMENTS

JP 2006-048783 A 2/2006
KR 10-0648290 B1 11/2006

* cited by examiner

*Primary Examiner* — Douglas King
(74) *Attorney, Agent, or Firm* — Lee & Morse, P.C.

(57) ABSTRACT

A programming method for a non-volatile memory device includes performing a programming operation to program memory cells, when the programmed memory cells are determined to include memory cells that failed to be programmed and when a current program loop is a maximum program loop, determining whether a number of the memory cells that failed to be programmed corresponds to a number of memory cells that can successfully undergo ECC (error checking and correction), when the number of the memory cells that failed to be programmed is less than the number of the memory cells that can successfully undergo ECC, reading data so as to determine whether a number of error bits of the memory cells that failed to be programmed can successfully undergo ECC, and, when the memory cells that failed to be programmed can successfully undergo ECC, ending a programming operation.

10 Claims, 5 Drawing Sheets

NON-VOLATILE MEMORY DEVICE AND ASSOCIATED PROGRAMMING METHOD USING ERROR CHECKING AND CORRECTION (ECC)

BACKGROUND

1. Field

Embodiments relate to a non-volatile memory device and an associated programming method using error checking and correction (ECC).

2. Description of the Related Art

Non-volatile memory devices such as flash memory devices may perform a verification operation to determine whether each memory cell has a desired threshold voltage following a programming operation. For example, NOR flash memory devices apply a specific high voltage to selected NOR flash memory cells, thereby programming data in the selected NOR flash memory cells. Accordingly, charges are stored in floating gates of the selected NOR flash memory cells so that each of the floating gates has a threshold voltage. After that, a specific verification voltage may be applied to determine whether each of the selected NOR flash memory cells is ON or OFF, and, in this manner, verify correct data in each NOR flash memory cell.

Some memory cells of the programmed NOR flash memory cells may have slower programming characteristics than other memory cells of the NOR flash memory cells. Such memory cells having the slower program characteristics may not be programmed to be higher than a target threshold voltage during a predetermined time period, and thus, the programming operation may fail and be abnormally ended due to the slow memory cells.

SUMMARY

Embodiments are directed to a non-volatile memory device and an associated programming method using error checking and correction (ECC), which substantially overcome one or more problems due to the limitations and disadvantages of the related art.

It is therefore a feature of an embodiment to provide a method of performing error checking and correction in a non-volatile memory device.

It is therefore another feature of an embodiment to provide a non-volatile memory device implementing error checking and correction.

At least one of the above and other features and advantages may be realized by providing a programming method for a non-volatile memory device, the programming method including performing a programming operation to program memory cells, when the programmed memory cells are determined to include memory cells that failed to be programmed and when a current program loop is a maximum program loop, determining whether a number of the memory cells that failed to be programmed corresponds to a number of memory cells that can successfully undergo ECC (error checking and correction), when the number of the memory cells that failed to be programmed is less than the number of the memory cells that can successfully undergo ECC, reading data so as to determine whether a number of error bits of the memory cells that failed to be programmed can successfully undergo ECC, and, when the memory cells that failed to be programmed can successfully undergo ECC, ending a programming operation.

The programming method may further include increasing a program loop count number and re-performing the programming operation when the programmed memory cells are determined to include memory cells that failed to be programmed and when the current program loop is not the maximum program loop.

At least one of the above and other features and advantages may also be realized by providing a programming method for a non-volatile memory device, the programming method including performing a programming operation to program memory cells, when the programmed memory cells are determined to include memory cells that failed to be programmed, determining whether a number of the memory cells that failed to be programmed corresponds to a number of memory cells that can successfully undergo ECC, when the number of the memory cells that failed to be programmed is less than the number of the memory cells that can successfully undergo ECC, reading data so as to determine whether a number of error bits of the memory cells that failed to be programmed can successfully undergo ECC, when the memory cells that failed to be programmed can successfully undergo ECC, ending a programming operation, and, when the memory cells that failed to be programmed cannot successfully undergo ECC and when a current program loop is a maximum program loop, abnormally ending the programming operation.

The programming method may further include increasing a program loop count number and re-performing the programming operation when the memory cells that failed to be programmed cannot successfully undergo ECC and when the current program loop is not the maximum program loop.

The programming method may further include abnormally ending the programming operation when the number of the memory cells that failed to be programmed is greater than the number of the memory cells that can successfully undergo ECC and when the current program loop is the maximum program loop.

The programming method may further include increasing a program loop count number and re-performing the programming operation when the number of the memory cells that failed to be programmed is greater than the number of the memory cells that can successfully undergo ECC and when the current program loop is not the maximum program loop.

The programming method may further include not performing counting of the number of the memory cells that failed to be programmed until an $(N-1)^{th}$ program loop is ended (where N is a number less than a number indicating a maximum program loop).

At least one of the above and other features and advantages may be realized by providing a non-volatile memory device, including a plurality of memory cells, a write control block configured to generate a plurality of control signals for performing a programming operation and a verification operation with respect to the plurality of memory cells, and an ECC check logic unit configured to count a number of memory cells that failed to be programmed in an ECC unit in a final program loop of the plurality of memory cells, configured to read data, and configured to, when a number of error bits of the memory cells that failed to be programmed can successfully undergo ECC, end the programming operation in response to the plurality of control signals.

At least one of the above and other features and advantages may be realized by providing a non-volatile memory device, including a plurality of memory cells, a write control block configured to generate a plurality of control signals for performing a programming operation and a verification operation with respect to the plurality of memory cells, and an ECC check logic unit configured to count a number of memory cells that failed to be programmed in an ECC unit in each of a plurality of program loops, configured to read data, and configured to, when a number of error bits of the memory cells that failed to be programmed can successfully undergo ECC, end the programming operation in response to the plurality of control signals.

At least one of the above and other features and advantages may be realized by providing a non-volatile memory device, including a plurality of memory cells, a write control block configured to generate a plurality of control signals for performing a programming operation and a verification operation with respect to the plurality of memory cells, and an ECC check logic unit configured to count a number of memory cells that failed to be programmed in an ECC unit from an $N^{th}$ (where N is a number less than a number indicating a maximum program loop) program loop, configured to read data, and configured to, when a number of error bits of the memory cells that failed to be programmed can successfully undergo ECC, ending the programming operation in response to the plurality of control signals.

BRIEF DESCRIPTION OF THE DRAWINGS

The above and other features and advantages will become more apparent to those of ordinary skill in the art by describing in detail example embodiments with reference to the attached drawings, in which.

DETAILED DESCRIPTION

Figure 1:
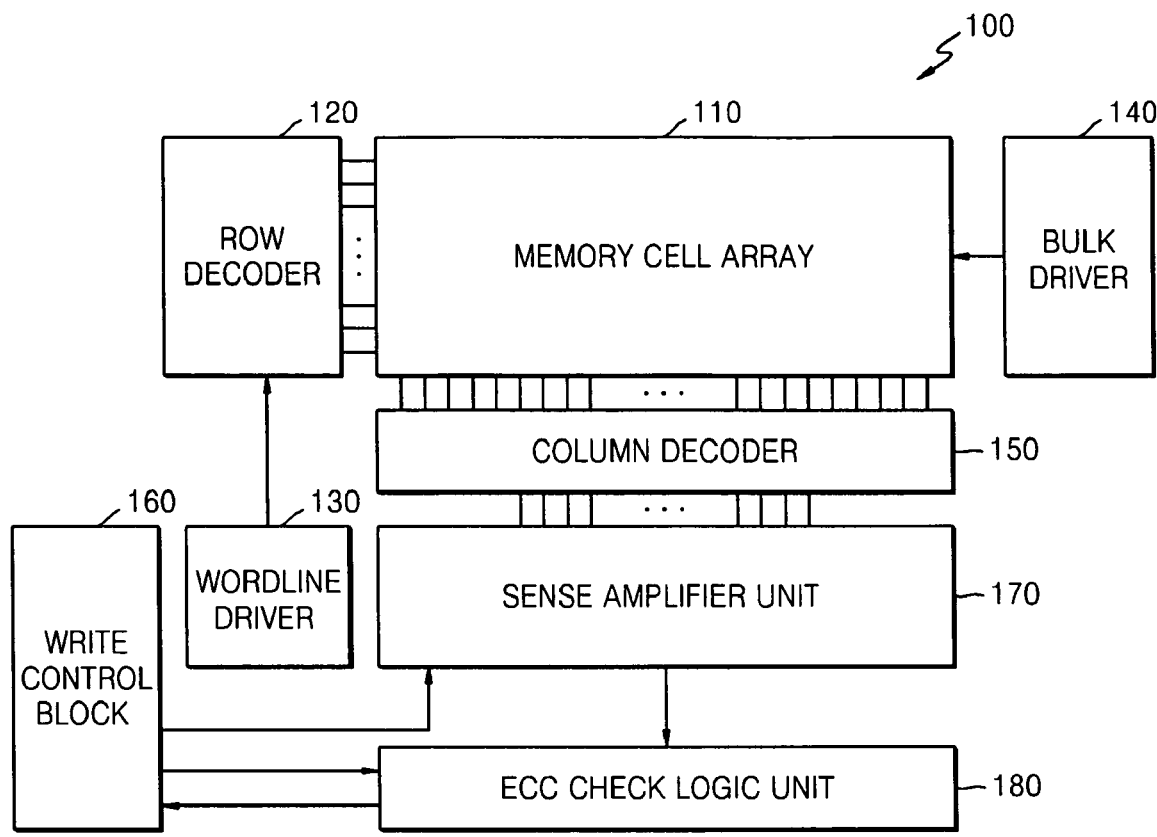
FIG. 1 illustrates a diagram of a non-volatile memory device according to a first embodiment.

Korean Patent Application No. 10-2008-0074092, filed on Jul. 29, 2008, in the Korean Intellectual Property Office, and entitled: "Non-Volatile Memory Device and Programming Method Via ECC," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

FIG. 1 illustrates a diagram of a non-volatile memory device 100 according to a first embodiment. Referring to FIG. 1, the non-volatile memory device 100 may include a memory cell array 110, a row decoder 120, a wordline driver 130, a bulk driver 140, a column decoder 150, a write control block 160, a sense amplifier unit 170, and an error checking and correction (ECC) check logic unit 180.

The memory cell array 110 may include a plurality of memory cells arrayed in a matrix of rows (or wordlines) and columns (or bitlines). The memory cells may be, e.g., flash memory cells arranged to have a NOR structure or a NAND structure. In particular examples described herein, the memory cells may be arranged to have the NOR structure and may be multi-bit memory cells, each storing multiple bits such as 2-bit information. However, embodiments are not limited to the particular examples.

The row decoder 120 may select wordlines of the memory cell array 110 in response to a row address. The wordline driver 130 may provide a voltage for driving wordlines selected according to a programming operation, a read operation, an erasing operation, a verification operation, and the like. According to operation modes of the non-volatile memory device 100, the bulk driver 140 may provide bias voltages, which correspond to the operation modes, to a bulk semiconductor substrate on which the memory cell array 110 is formed. The column decoder 150 may select bitlines of the memory cell array 110 in response to a column address.

The write control block 160 may generate timing control signals for a programming operation and a verification operation of the non-volatile memory device 100, and may control the sense amplifier unit 170 and the ECC check logic unit 180. The sense amplifier unit 170 may write data to memory cells in the memory cell array 110 selected by the row decoder 120 and the column decoder 150. The sense amplifier unit 170 may also read data from the memory cells in the memory cell array 110. The sense amplifier unit 170 may include a plurality of sense amplifiers, each being connected to a bitline of the memory cell array 110.

A program verification operation may determine a number of memory cells that failed to be programmed by a programming operation. The ECC check logic unit 180 may count the number of memory cells that failed to be programmed in the program verification operation performed by the write control block 160, may determine whether the number of the failed memory cells corresponds to a predetermined number of memory cells, and may determine whether the failed memory cells can successfully undergo ECC. The predetermined number of memory cells, that is, the number of recoverable memory cells, and the number of the failed memory cells that can successfully undergo ECC, will be described further in connection with the programming methods according to the second, third, and fourth embodiments detailed below with reference to FIGS. 2 through 5.

In the second embodiment, the ECC check logic unit 180 may count the number of memory cells that failed to be programmed and may determine whether it is possible to successfully undergo ECC with respect to the failed memory cells in a final program loop. In the third embodiment, the ECC check logic unit 180 may count the number of memory cells that failed to be programmed and may determine whether it is possible to successfully undergo the ECC with respect to the failed memory cells in every program loop. In the fourth embodiment, the ECC check logic unit 180 may not count the number of memory cells that failed to be programmed until a $(N-1)^{th}$ program loop is ended (where N is a number that is less than a number indicating a maximum program loop), and may then count the number of the failed memory cells and determine whether it is possible to successfully undergo the ECC with respect to the failed memory cells in an $N^{th}$ program loop.

Figure 2:
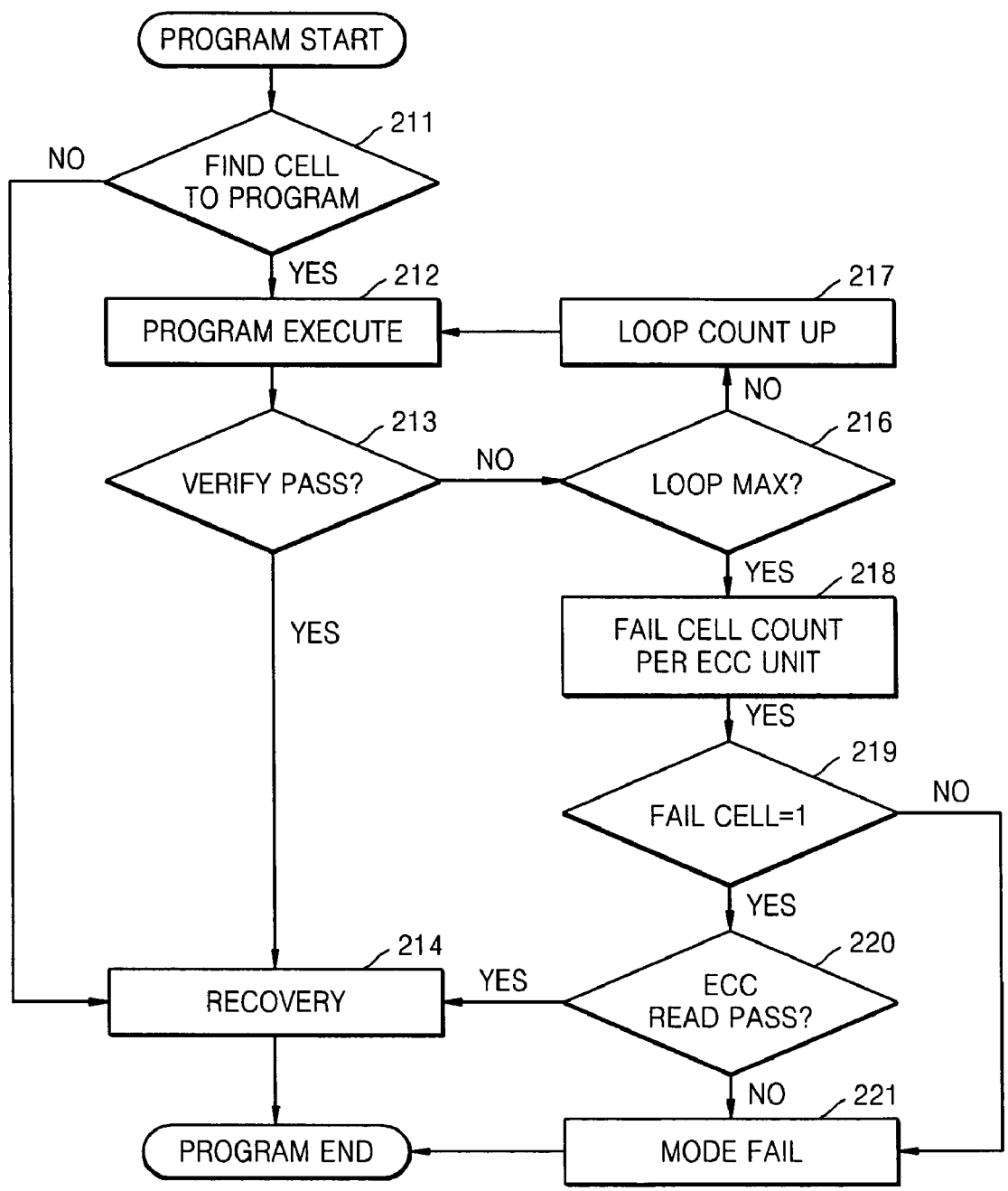
FIG. 2 illustrates a flowchart of a programming method performed by the non-volatile memory device of FIG. 1, according to a second embodiment.

FIG. 2 illustrates a flowchart of a programming method performed by the non-volatile memory device of FIG. 1, according to the second embodiment. In the second embodiment, when the non-volatile memory device 100 enters a programming operation mode, it is determined whether there are memory cells to be programmed (operation 211). When there are memory cells to be programmed, data bits to be programmed may be loaded into sense amplifiers connected to bitlines selected by the column decoder 150, and the memory cells connected to wordlines selected by the row decoder 120 may be programmed with data loaded by the write control block 160 (operation 212). The programming method may be performed through a plurality of program loops, each loop including the programming operation 212 and a verification operation 213.

When the programming operation 212 of a first program loop is performed, the verification operation may be performed by the write control block 160 (operation 213). The verification operation 213 may determine whether the programmed memory cells have a desired threshold voltage. As a result of the verification operation in operation 213, when the programmed memory cells are determined to be memory cells that passed programming, i.e., when a failed memory cell is not found ("Verify Pass?" is YES in operation 213 in FIG. 2), a program recovery operation for preparing a read operation mode of the non-volatile memory device 100 may be performed (operation 214). After that, the programming operation may be ended (operation 215). As another result of the verification operation in operation 213, when the programmed memory cells are determined to include memory cells that failed to be programmed ("Verify Pass?" is NO in operation 213 in FIG. 2), it is determined whether a current program loop is a maximum program loop (operation 216). As a result of the determination in operation 216, when the current program loop is not the maximum program loop, a program loop count number is increased by +1 (operation 217), and the programming operation is re-performed (operation 212).

As a result of the determination in operation 216, when the current program loop is the maximum program loop, i.e., the final program loop ("Loop Max?" is YES in operation 218 in FIG. 2), it is determined whether the number of the failed memory cells counted by the ECC check logic unit 180 corresponds to the predetermined number of memory cells that can successfully undergo ECC (operations 218 and 219). For example, the predetermined number of the memory cells that can successfully undergo ECC may be set as 1, as indicated by the label "Fail Cell=1" in operation 219 of FIG. 2. When the number of the failed memory cells is 2 or greater ("Fail Cell=1" is NO in operation 219), programming operation fail information may be transferred to the write control block 160 (operation 221), and the programming operation may be abnormally ended (operation 215). In the case that the number of failed memory cells is 0, the sequence of operations may pass from operation 213 to operation 214, as described above.

In further detail, when the number of the failed memory cells is 1 (operation 219), the failed memory cells may be read to determine whether it is possible to successfully undergo ECC with respect to the failed memory cells (operation 220). In ECC, when detecting and correcting an error bit, a 1-bit error may be easily corrected. However, it may take a significantly longer time to correct a 2-bit error, as compared to the time required to correct the 1-bit error. Accordingly, in an implementation, 1-bit errors may be corrected using ECC with respect to the failed memory cells ("ECC Read Pass" is YES in operation 220 of FIG. 2), whereas 2-bit errors may not be corrected ("ECC Read Pass" is NO in operation 220 of FIG. 2) (this is described further in connection with FIGS. 3A and 3B). It will be appreciated, however, that other criteria may be used in determining the outcome of operation 220.

As a result of the determination in operation 220, when it is possible to successfully undergo the ECC with respect to the failed memory cells, i.e., "ECC Read Pass" is YES, the program recovery operation for preparing a read operation mode of the non-volatile memory device 100 may be performed (operation 214), and then the programming operation may be ended (operation 215). As another result of the determination in operation 220, when it is not possible to successfully undergo the ECC with respect to the failed memory cells ("ECC Read Pass" is NO in operation 220), the programming operation fail information may be transferred to the write control block 160 (operation 221) and the programming operation may be abnormally ended ("Mode Fail," operation 215).

Figure 3A:
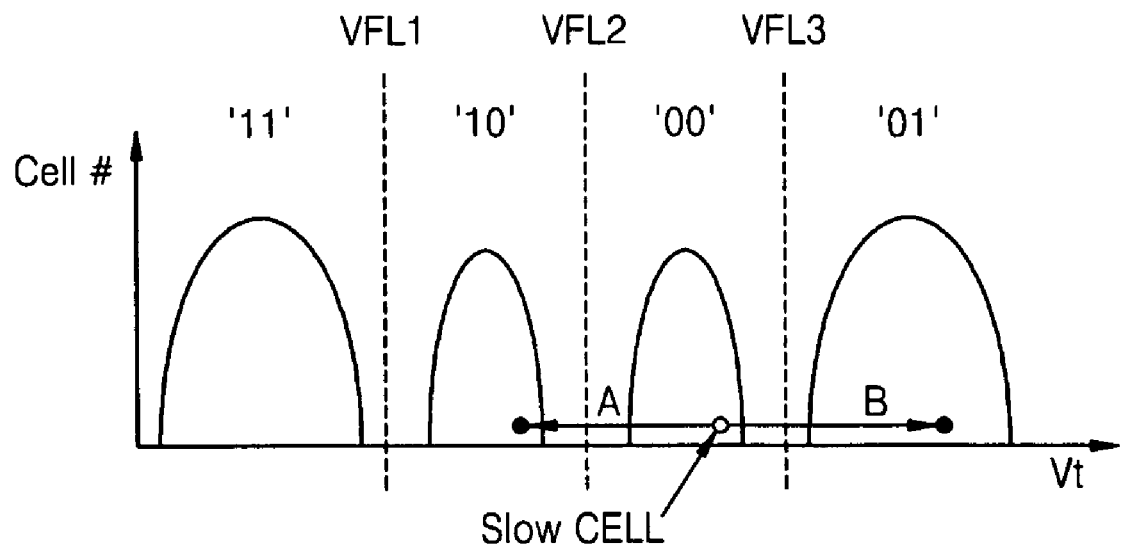
FIGS. 3A and 3B illustrate examples of error checking and correction (ECC) for a two-bit cell.
Figure 3B:
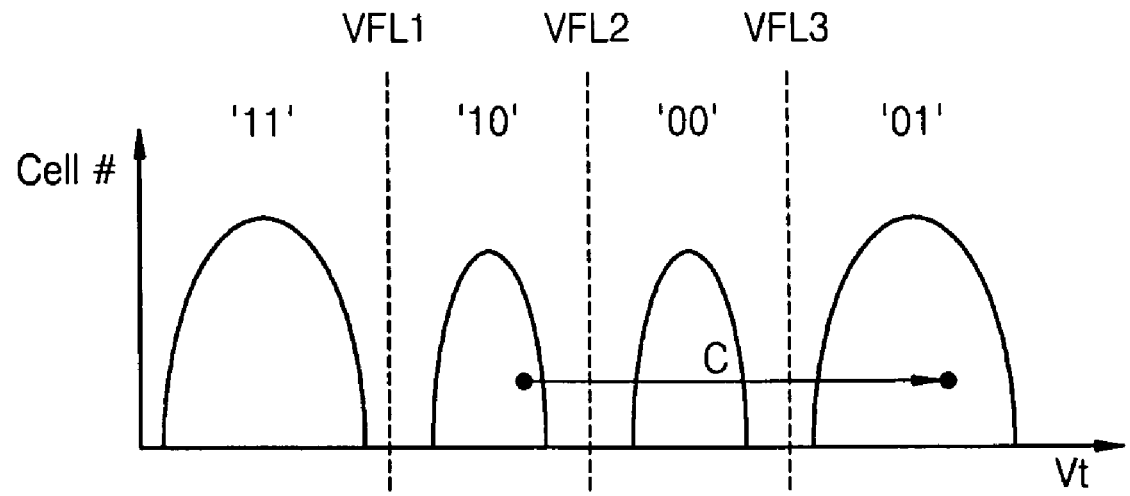

FIGS. 3A and 3B illustrate examples of error checking and correction (ECC) for a two-bit cell. Referring to FIG. 3A, memory cells arrayed in the memory cell array 110 of FIG. 1 may each store 2-bit information and, thus, have 4, i.e., $2^2$, status values. That is, the memory cells may individually have a '11' status, a '10' status, a '00' status, and a '01' status. Herein, a memory cell having a slower program characteristic than other memory cells in the memory cell array 110 is referred to as a "slow cell." In FIG. 3A, the slow cell is supposed to be in the '00' status after being programmed. In the case where the slow memory cell that failed to be programmed is in the '10' status (refer to A in FIG. 3A), when the '10' status memory cell is read via first through third verification voltages VFL1, VFL2, and VFL3, the '10' status memory cell is determined to be failed at the second verification voltage VFL2. The slow cell in the '10' status has a most significant bit (MSB) error, compared to its expected '00' status. That is, the slow cell has a 1-bit error. For the case that 1-bit errors are to be corrected, the slow cell may be determined to be correctable via the ECC, i.e., this slow cell is determined in operation 220 as being a cell that can successfully undergo ECC ("ECC Read Pass"=YES in operation 220 in FIG. 2).

Still referring to FIG. 3A, in the case where the slow memory cell is over-programmed and, thus, is in the '01' status (refer to B in FIG. 3A), when the '01' status memory cell is read via the first through third verification voltages VFL1, VFL2, and VFL3, the '01' status memory cell may be determined to be failed at the third verification voltage VFL3. The failed memory cell in the '01' status has a least significant bit (LSB) error, compared to its expected '00' status. That is, the failed memory cell has a 1-bit error. Since the failed memory cell may be determined to be correctable via the ECC, this failed memory cell may be determined to be a cell that can successfully undergo ECC ("ECC Read Pass"=YES in operation 220 in FIG. 2).

Referring to FIG. 3B, in the case where the failed memory cell, which is expected to be in the '10' status after being programmed, is over-programmed and thus, is in a '01' status (refer to C in FIG. 3B), when the '01' status memory cell is read via first through third verification voltages VFL1, VFL2, and VFL3, the '01' status memory cell may be determined to be failed at the third verification voltage VFL3. The failed memory cell in the '01' status has MSB and LSB errors, compared to its expected '10' status, i.e., the failed memory cell has a 2-bit error. For the case that 2-bit errors are not to be corrected via the ECC, this failed memory cell may be determined to be a cell that cannot successfully undergo ECC ("ECC Read Pass"=NO in operation 220 in FIG. 2).

Figure 4:
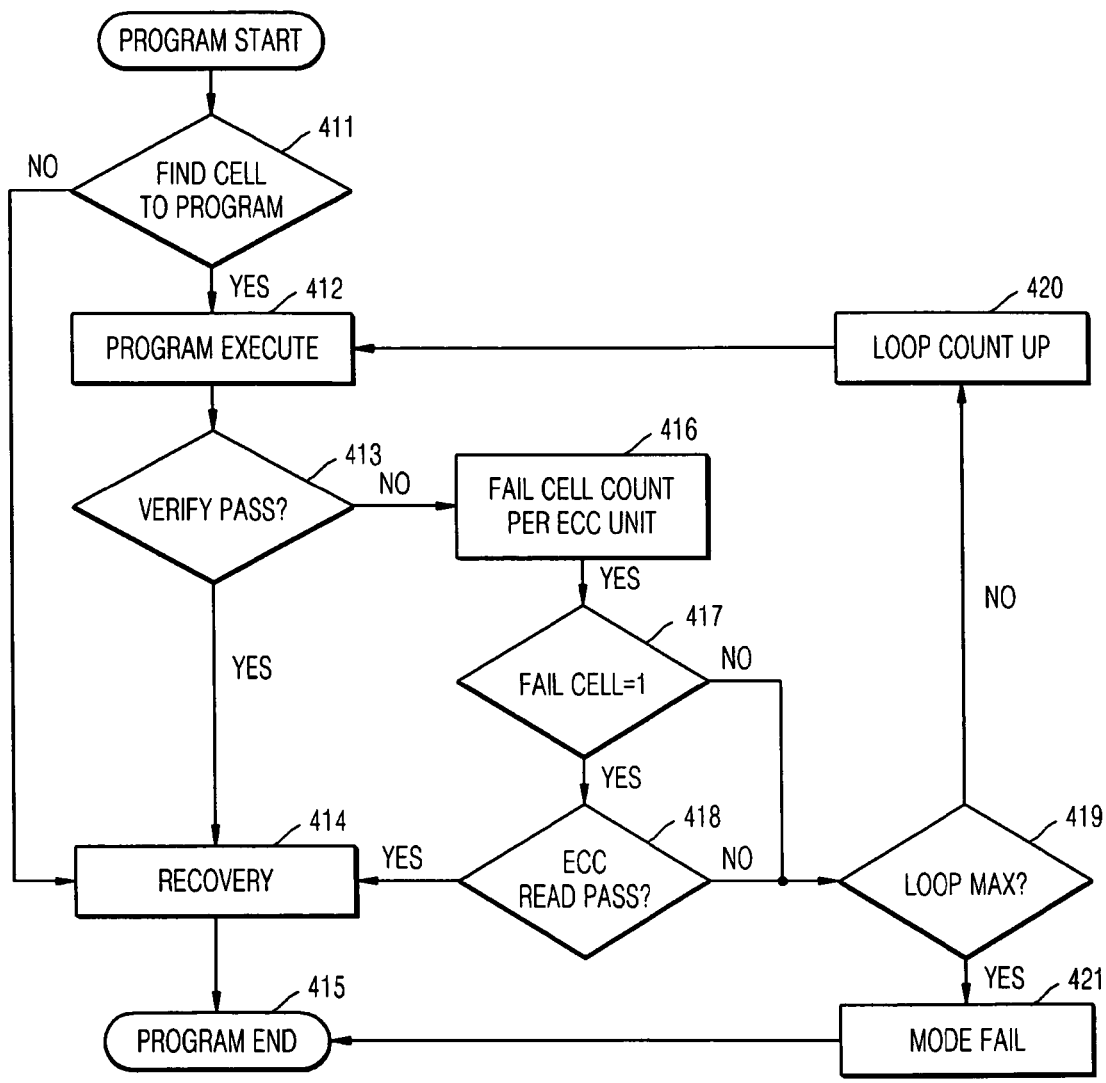
FIG. 4 illustrates a flowchart of a programming method performed by the non-volatile memory device of FIG. 1, according to a third embodiment.

FIG. 4 illustrates a flowchart of a programming method performed by the non-volatile memory device of FIG. 1, according to the third embodiment. Referring to FIG. 4, operations 411 through 415 may be the same as operations 211 through 215 of FIG. 1 and, thus, detailed descriptions thereof will not be repeated. The programming method of FIG. 2 may take a significant amount of time to perform a programming operation, since counting of the number of memory cells that failed to be programmed in the ECC unit, and determination of whether it is possible to successfully undergo the ECC with respect to the failed memory cells, may not be performed until the maximum, i.e., final, program loop. Accordingly, in the third embodiment, the duration of the programming method may be reduced by counting of the number of the failed memory cells in an ECC unit, and determining whether it is possible to successfully undergo ECC with respect to the failed memory cells, in every program loop. By doing so, if the failed memory cells are determined to be cells that can successfully undergo ECC ("ECC Read Pass"=YES in operation 418, described below), a program loop number may not be incremented further, and the programming operation may be normally ended (operation 414).

In a verification operation performed to determine whether programmed memory cells have a desired threshold voltage (operation 413), when the programmed memory cells are determined to include memory cells that failed to be programmed, it is determined whether the number of the failed memory cells counted by the ECC check logic unit 180 corresponds to the predetermined number of memory cells that can successfully undergo ECC (operations 416 and 417). When the number of the failed memory cells is 2 or greater (operation 417), it may then be determined whether a current program loop is a maximum program loop (operation 419). When the number of the failed memory cells is 1 ("Fail Cell=1" is YES in operation 417), the failed memory cells may be read to determine whether it is possible to successfully undergo ECC with respect to the failed memory cells (operation 418). As a result of the determination in operation 418, when it is possible to successfully undergo the ECC with respect to the failed memory cell ("ECC Read Pass" is YES in operation 418 of FIG. 4), a program recovery operation for preparing a read operation mode of the non-volatile memory device 100 may be performed (operation 414), and then the programming operation may be ended (operation 415). As another result of the determination in operation 418, when it is not possible to successfully undergo the ECC with respect to the failed memory cell ("ECC Read Pass" is NO in operation 418 of FIG. 4), it may then be determined whether a current program loop is the maximum program loop (operation 419). As a result of the determination in operation 419, when the current program loop is not the maximum program loop, a program loop count number is increased by +1 (operation 420), and the programming operation may be re-performed (operation 412). As another result of the determination in operation 419, when the current program loop is the maximum program loop ("Loop Max" is YES in operation 419 of FIG. 4), programming operation fail information may be transferred to the write control block 160 (operation 421), and the programming operation may be abnormally ended (operation 415).

Figure 5:
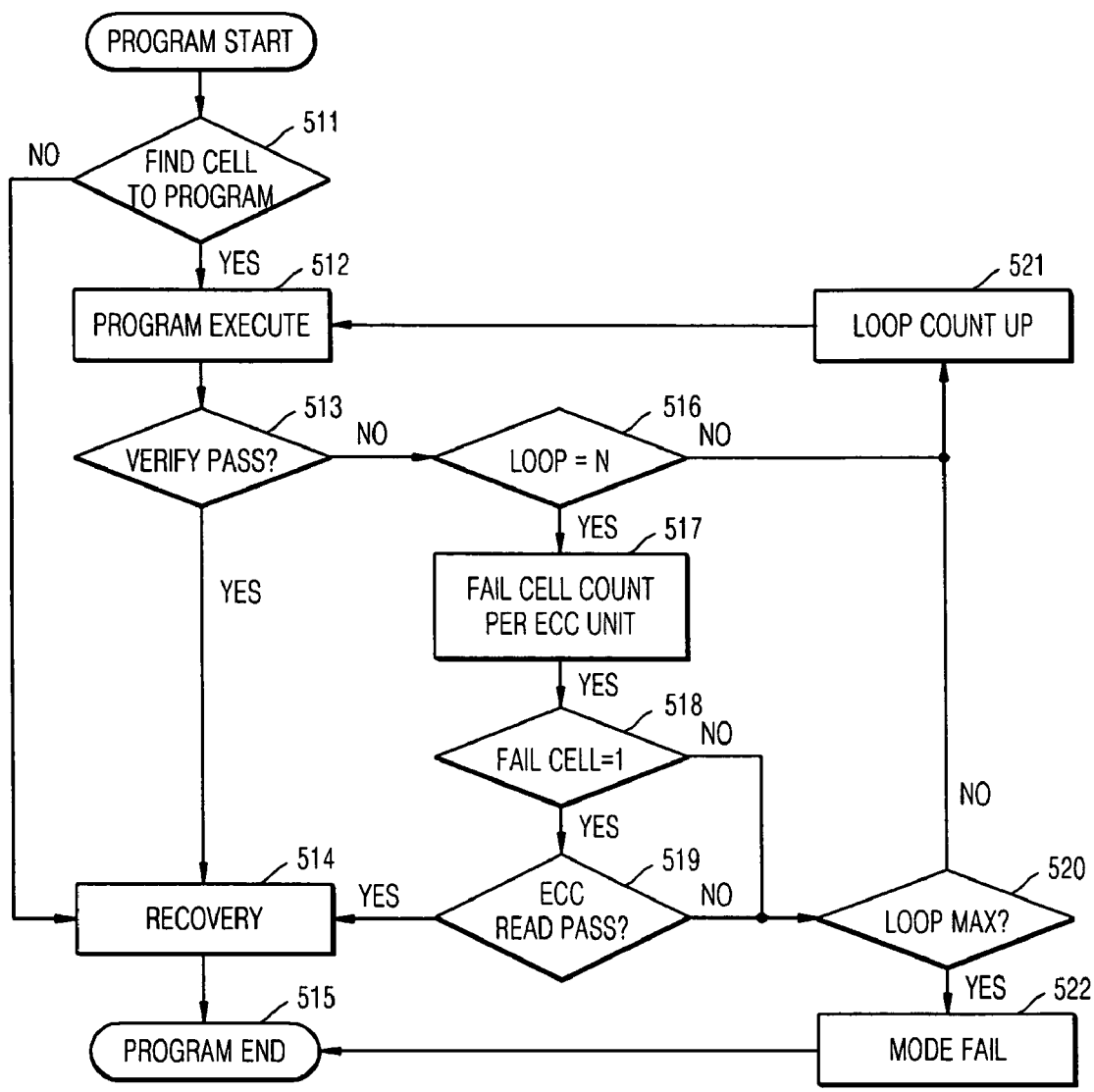
FIG. 5 illustrates a flowchart of a programming method performed by the non-volatile memory device of FIG. 1, according to a fourth embodiment.

FIG. 5 illustrates a flowchart of a programming method performed by the non-volatile memory device of FIG. 1, according to the fourth embodiment. Referring to FIG. 5, operations 511 through 515 may be the same as operations 211 through 215 of FIG. 1, and thus, detailed descriptions thereof will not be repeated.

In a verification operation performed to determine whether programmed memory cells have a desired threshold voltage (operation 513), when the programmed memory cells are determined to include memory cells that failed to be programmed, it is then determined whether a current program loop is an $N^{th}$ program loop (operation 516). The $N^{th}$ program loop is set in such a manner that the programming method of FIG. 4 is not performed until an $(N-1)^{th}$ program loop is ended. In contrast, the programming method of FIG. 4 counts the number of failed memory cells in the ECC unit and determines whether it is possible to successfully undergo the ECC with respect to the failed memory cells, in every program loop. In the fourth embodiment, N is set to be a number less than a number indicating a maximum program loop. Accordingly, the programming method of FIG. 5 may reduce a programming time, as compared to that of the programming method of FIG. 4.

As a result of the determination in operation 516, when the current program loop is not the $N^{th}$ program loop ("Loop=N" is NO in operation 516 in FIG. 5), a program loop count number is increased by +1 (operation 521), and a programming operation is re-performed (operation 512). As another result of the determination in operation 516, when the current program loop is the $N^{th}$ program loop ("Loop=N" is YES in operation 516 in FIG. 5), it is determined whether the number of the failed memory cells counted by the ECC check logic unit 180 corresponds to the predetermined number of memory cells that can successfully undergo ECC (operations 517 and 518). When the number of the failed memory cells is 2 or greater ("Fail Cell=1" is NO in operation 518 in FIG. 5), it is determined whether the current program loop is the maximum program loop (operation 520). When the number of the failed memory cells is 1 ("Fail Cell=1" is YES in operation 518 in FIG. 5), the failed memory cells are read to determine whether it is possible to successfully undergo ECC with respect to the failed memory cells (operation 519). As a result of the determination in operation 519, when it is possible to successfully undergo the ECC with respect to the failed memory cells ("ECC Read Pass" is YES in operation 519 in FIG. 5), a program recovery operation for preparing a read operation mode of the non-volatile memory device 100 may be performed (operation 514), and then the programming operation may be ended (operation 515). As another result of the determination in operation 519, when it is not possible to successfully undergo the ECC with respect to the failed memory cells ("ECC Read Pass" is NO in operation 519 in FIG. 5), it is determined whether the current program loop is the maximum program loop (operation 520). As a result of the determination in operation 520, when the current program loop is not the maximum program loop, a program loop count number is increased by +1 (operation 521), and the programming operation is re-performed (operation 512). As another result of the determination in operation 520, when the current program loop is the maximum program loop, programming operation fail information may be transferred to the write control block 160 (operation 522), and the programming operation may be abnormally ended ("Mode Fail" in operation 515 of FIG. 5).

As described above, methods and non-volatile memory devices according to embodiments may provide a way to recover slow memory cells in a memory device, e.g., a NOR flash memory device. Thus, where slow program characteristics of the memory cells occur in a program-erase operation cycle, write errors may be corrected. This may reduce apparent defects in the memory device.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A programming method for a multi-level cell non-volatile memory device, the programming method comprising:
    performing a programming operation to program memory cells of the memory device, the memory cells being multi-level cells;

when the programmed memory cells are determined to include one or more memory cells that failed to be programmed and when a current program loop is a maximum program loop, determining whether a number of the one or more memory cells that failed to be programmed corresponds to a number of memory cells that can successfully undergo ECC (error checking and correction);

when the number of the one or more memory cells that failed to be programmed is less than or equal to the number of the memory cells that can successfully undergo ECC, reading multi-bit data from a memory cell that failed to be programmed and examining the bits of the multi-bit data read from the memory cell that failed to be programmed so as to determine whether a number of error bits of the multi-bit data read from the memory cell that failed to be programmed can successfully undergo ECC; and when the number of error bits of the memory cell that failed to be programmed can successfully undergo ECC, ending a programming operation.

2. The programming method as claimed in claim 1, further comprising increasing a program loop count number and re-performing the programming operation when the programmed memory cells are determined to include one or more memory cells that failed to be programmed and when the current program loop is not the maximum program loop.

3. The method as claimed in claim 1, wherein:
the multi-bit data is data of at least two bits, such that the memory device stores data of at least two bits per cell, and
when the multi-bit data read from the memory cell that failed to be programmed has an error in less than all of the at least two bits, performing a program recovery operation for preparing a read operation mode.

4. The method as claimed in claim 1, wherein:
the multi-bit data is two-bit data, such that the memory device stores two-bit data per cell, the two-bit data having a most significant bit (MSB) and a least significant bit (LSB),
when the two-bit data read from the memory cell that failed to be programmed has an error in only one of the MSB and the LSB, performing a program recovery operation for preparing a read operation mode, and
when the two-bit data has an error in both the MSB and the LSB, abnormally ending the programming operation.

5. The method as claimed in claim 1, wherein:
the multi-bit data is data of at least two bits, such that the memory device stores data of at least two bits per cell, values of programmed bits of the multi-bit data being determined by at least three threshold voltages, and
when the multi-bit data read from the memory cell that failed to be programmed has an error such that there is a number of threshold voltages that is less than the total number of the at least three threshold voltages between the actual value of the programmed bits and the expected value of the programmed bits, performing a program recovery operation for preparing a read operation mode.

6. The method as claimed in claim 1, wherein:
the multi-bit data is two-bit data, such that the memory device stores two-bit data per cell, values of programmed bits of the two-bit data being determined by three threshold voltages, when the two-bit data read from the memory cell that failed to be programmed has an error such that there is only one threshold voltage of the three threshold voltages between the actual value of the programmed bits and the expected value of the programmed bits, performing a program recovery operation for preparing a read operation mode, and when the two-bit data has an error such that there is more than one threshold voltage of the three threshold voltages between the actual value of the programmed bits and the expected value of the programmed bits, abnormally ending the programming operation.

7. A programming method for a multi-level cell non-volatile memory device, the programming method comprising:
performing a programming operation to program memory cells of the memory device, the memory cells being multi-level cells;

when the programmed memory cells are determined to include one or more memory cells that failed to be programmed, determining whether a number of the one or more memory cells that failed to be programmed corresponds to a number of memory cells that can successfully undergo ECC (error checking and correction);

when the number of the one or more memory cells that failed to be programmed is less than or equal to the number of the memory cells that can successfully undergo ECC, reading multi-bit data from a memory cell that failed to be programmed and examining the bits of the multi-bit data read from the memory cell that failed to be programmed so as to determine whether a number of error bits of the multi-bit data read from the memory cell that failed to be programmed can successfully undergo ECC;

when the number of error bits of the memory cell that failed to be programmed can successfully undergo ECC, ending a programming operation; and when the number of error bits of the memory cell that failed to be programmed cannot successfully undergo ECC and when a current program loop is a maximum program loop, abnormally ending the programming operation.

8. The programming method as claimed in claim 7, further comprising abnormally ending the programming operation when the number of the one or more memory cells that failed to be programmed is greater than the number of the memory cells that can successfully undergo ECC and when the current program loop is the maximum program loop.

9. The programming method as claimed in claim 7, further comprising increasing a program loop count number and re-performing the programming operation when the number of the one or more memory cells that failed to be programmed is greater than the number of the memory cells that can successfully undergo ECC and when the current program loop is not the maximum program loop.

10. The programming method as claimed in claim 7, further comprising not performing counting of the number of the one or more memory cells that failed to be programmed until an $(N-1)^{th}$ program loop is ended (where N is a number less than a number indicating a maximum program loop).

* * * * *